(12) United States Patent
Sasano

(10) Patent No.: US 9,245,873 B2
(45) Date of Patent: Jan. 26, 2016

(54) LIGHT EMITTING DEVICE

(75) Inventor: Haruaki Sasano, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 528 days.

(21) Appl. No.: 13/087,950

(22) Filed: Apr. 15, 2011

(65) Prior Publication Data

US 2011/0254022 A1 Oct. 20, 2011

(30) Foreign Application Priority Data

Apr. 16, 2010 (JP) ................................. 2010-094718
Mar. 28, 2011 (JP) ................................. 2011-069193

(51) Int. Cl.
*H01L 33/08* (2010.01)
*H01L 25/075* (2006.01)
*H01L 33/60* (2010.01)
*H01L 33/62* (2010.01)

(52) U.S. Cl.
CPC ............. *H01L 25/0753* (2013.01); *H01L 33/60* (2013.01); *H01L 33/62* (2013.01); *H01L 2224/48137* (2013.01)

(58) Field of Classification Search
USPC ..................................... 257/77–103, E33.072
See application file for complete search history.

(56) References Cited

U.S. PATENT DOCUMENTS

| | | | |
|---|---|---|---|
| 2005/0082550 A1* | 4/2005 | Hamaoka et al. ................ | 257/80 |
| 2007/0194422 A1 | 8/2007 | Lai et al. | |
| 2009/0166657 A1* | 7/2009 | Yamada et al. ................ | 257/98 |
| 2009/0219728 A1* | 9/2009 | Hata et al. ..................... | 362/382 |
| 2009/0315057 A1 | 12/2009 | Konishi et al. | |
| 2010/0046220 A1 | 2/2010 | Fukasawa et al. | |
| 2011/0116252 A1* | 5/2011 | Agatani et al. ................ | 362/84 |

FOREIGN PATENT DOCUMENTS

| | | |
|---|---|---|
| JP | 2006-295085 A | 10/2006 |
| JP | 2007-227882 A | 9/2007 |
| JP | 2008-053663 A | 3/2008 |
| JP | 2009-094207 A | 4/2009 |
| JP | 2009-164157 A | 7/2009 |
| JP | 2010-34487 A | 2/2010 |
| JP | 2011-108744 A | 6/2011 |

\* cited by examiner

*Primary Examiner* — Ori Nadav
*Assistant Examiner* — Vernon P Webb
(74) *Attorney, Agent, or Firm* — Birch, Stewart, Kolasch & Birch, LLP

(57) ABSTRACT

There is presented a light emitting device, having plural light emitting elements disposed on a substrate, in which a protection element, such as a zener diode, can be disposed at an appropriate position. The light emitting device includes: a substrate; a light emitting section having plural light emitting elements disposed in a mounting area on the substrate; a positive electrode and negative electrode each having a pad section and wiring section to apply voltage to the light emitting section through the wiring sections; a protection element disposed at one of the positive electrode and negative electrode and electrically connected with the other one electrode; and a light reflecting resin formed on the substrate such as to cover at least the wiring sections and the protection element, wherein the wiring sections are formed along the periphery of the mounting area such that one end portions thereof are adjacent to each other.

33 Claims, 8 Drawing Sheets

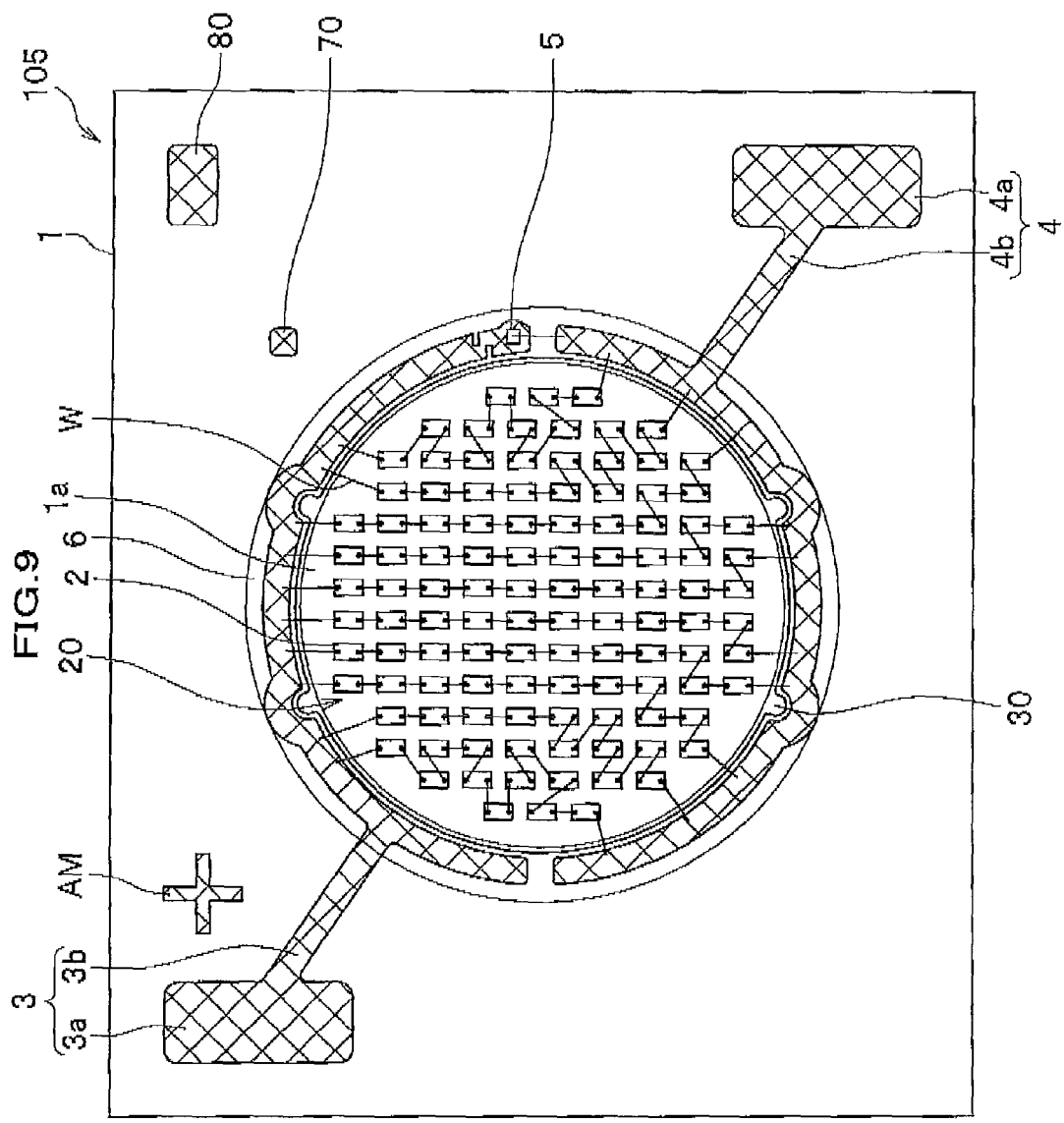

LIGHT EMITTING DEVICE

CROSS REFERENCE TO RELATED APPLICATION

The application claims the foreign priority benefit under Title 35, United States Code, Section 119(a)-(d) of Japanese Patent Application No. 2010-094718 filed on Apr. 16, 2010 and Japanese Patent Application No. 2011-069193 filed on Mar. 28, 2011 the contents of which are hereby incorporated by reference.

BACKGROUND OF THE INVENTION

1. Field of the Invention

The present invention relates to a light emitting device usable for a lighting device such as an LED bulb, a display unit, a display, the back light source of a liquid crystal display, and the like.

2. Description of the Related Art

In recent years, various kinds of light emitting devices using LEDs (light emitting diodes) as light emitting elements have been developed, because the amount of heat generation and the power consumption by LEDs are smaller than those of light sources by a filament bulb or the like, and LEDs have a longer life.

For example, Unexamined Japanese Patent Application Publication No. 2006-295085 presents a light source unit, with light emitting diodes, that is provided with a base plate on which a plurality of light emitting diode elements are mounted, a printed board arranged on the top surface of the base plate, and cathode/anode terminal electrodes formed on the printed board such as to sandwich the area where the plurality of light emitting diode elements are mounted.

Further, Unexamined Japanese Patent Application Publication No. 2010-034487 presents a light emitting device provided with a substrate on which a glass layer is formed, a plurality of LED chips arranged on the glass layer, and the external connection terminal of a positive electrode and the external connection terminal of a negative electrode formed on the glass layer such as to sandwich the plurality of LED chips.

Still further, to prevent an LED chip from being damaged by high-voltage static electricity, Unexamined Japanese Patent Application Publication No. 2007-227882 presents an LED package provided with an ESD protecting section, with a zener diode or the like, that is arranged in an area where the lead frame on the anode side and the lead frame on the cathode side are adjacent to each other.

Light emitting devices with arrangement of several tens of light emitting elements on a substrate have been widely developed to improve the brightness of a light emitting device. For such a light emitting device having a plurality of light emitting elements mounted thereon, it is recommended to arrange a protection element, such as the above-described zener diode, on the substrate so as to prevent element destruction and deterioration of performance which could occur when an over voltage is applied to the light emitting elements on the substrate.

However, in a conventional technology, the position of arranging a protection element has not been sufficiently considered in a case of arranging a plurality of elements on a substrate. For example, in the Unexamined Japanese Patent Application Publication No. 2006-295085 and the Unexamined Japanese Patent Application Publication No. 2010-034487, using a protection element is not considered at all, and no means have been presented for preventing element destruction and the deterioration of performance which can occur when an over voltage is applied to a plurality of light emitting elements. Further, in Unexamined Japanese Patent Application Publication No. 2007-227882, only the position of arranging a protection element in a case of mounting a single light emitting element is considered, and no consideration is made regarding a case of arranging a plurality of light emitting elements on a substrate.

The present invention has been developed, addressing the above-described problems, and an object of the invention is to provide a light emitting device with a plurality of light emitting elements arranged on a substrate, wherein a protection element with a zener diode or the like can be arranged at an appropriate position.

SUMMARY OF THE INVENTION

In order to solve the above-described problems, a light emitting device, according to the present invention, includes: a substrate; a light emitting section having a plurality of light emitting elements disposed in a mounting area on the substrate; a positive electrode and a negative electrode both of which having a pad section and a wiring section, wherein the positive and negative electrodes apply voltage to the light emitting section through the respective wiring sections; a protection element that is disposed at one of the positive electrode and the negative electrode and electrically connected with the other one of the positive electrode and the negative electrode; and a light reflecting resin formed on the substrate such as to cover at least the wiring sections and the protection element, wherein the wiring section of the positive electrode and the wiring section of the negative electrode are formed along a periphery of the mounting area such that one end portions thereof are adjacent to each other.

With this arrangement, even in a case of arranging a plurality of light emitting elements on a substrate, by forming the respective wiring sections of the positive electrode and the negative electrode along the periphery of the mounting area such that the one end portions thereof are adjacent to each other, it is possible to dispose the protection element at an appropriate position. Accordingly, it is possible to prevent that the voltage between the positive electrode and the negative electrode becomes higher than the zener voltage, and it is thereby possible to appropriately prevent occurrence of element destruction and deterioration of performance of light emitting elements which could be caused when an over voltage is applied.

Further, the light emitting device according to the invention is preferably arranged to further include: a relay wiring section formed along the periphery of the mounting area, wherein each of the plurality of light emitting elements has a p-electrode formed on one side and an n-electrode formed on the other side, wherein the p-electrodes between the wiring section of the positive electrode and the relay wiring section are arrayed such as to face one direction with respect to the mounting area, and wherein the p-electrodes between the wiring section of the negative electrode and the relay wiring section are arrayed such as to face the other one direction with respect to the mounting area.

With this arrangement, the relay wiring section is formed along the periphery of the mounting area and the light emitting elements are disposed such that the direction is reversed at the relay wiring section 8. Thereby, without making the wiring for connection of the light emitting elements to each other be complicated, the number of serially connected light emitting elements can be increased in a limited area size of the mounting area. Further, it is possible to densely dispose a plurality of light emitting elements in a limited area size of the mounting area, which makes it possible to obtain a light emitting device with improvement in power consumption for a certain brightness, or a light emitting device with improvement in the efficiency of light emission for a certain power consumption.

Still further, the light emitting device according to the invention is preferably arranged such that the plurality of light emitting elements are electrically connected to each other both serially and in parallel.

With this arrangement, by connecting a plurality of light emitting elements to each other not only serially but also in parallel, even if there is a variation in the forward voltage drop between a plurality of individual light emitting elements, the differences between outputs of light emitting elements connected in parallel can be reduced. Thus, it is possible to reduce variation in emitted light due to variation in the forward voltage drop between light emitting elements.

Yet further, the light emitting device according to the invention is preferably arranged such that the mounting area is formed in a certain shape having sides which face each other, and the wiring section of the positive electrode and the wiring section of the negative electrode are formed within a range of one side of the mounting area such that one end portions thereof are adjacent to each other.

With this arrangement, by forming the wiring sections such as to be adjacent to each other within the range of one side of the mounting area, an area for setting the wires for electrically connecting the wiring sections and the light emitting elements can be ensured. Consequently, the number of light emitting elements to be connected with the wiring sections, in other words, the number of light emitting elements 2 to be at the start point and the end point of each serial connection can be increased, and the number of lines of serial connection of light emitting elements on the mounting area can be increased. By thus increasing the number of lines of serial connection, a plurality of light emitting elements can be densely disposed in the limited area size of the mounting area, and it is thereby possible to obtain a light emitting device whose power consumption is improved for a certain brightness or whose light emission is improved for a certain power consumption.

Further, the light emitting device according to the invention is preferably arranged such that the mounting area is formed in a circular shape, and the wiring section of the positive electrode and the wiring section of the negative electrode are formed in the periphery of the circular mounting area such that one end portions thereof are adjacent to each other.

With this arrangement, even in a case of arranging a plurality of light emitting elements in a circular mounting area on a substrate, by forming the respective wiring sections of the positive electrode and the negative electrode along the periphery of the circular mounting area such that the one end portions thereof are adjacent to each other, it is possible to dispose the protection element at an appropriate position. Accordingly, it is possible to prevent that the voltage between the positive electrode and the negative electrode becomes higher than the zener voltage, and it is thereby possible to appropriately prevent occurrence of element destruction and deterioration of performance of light emitting elements which could be caused when an over voltage is applied.

Still further, the light emitting device according to the invention is preferably arranged such that the light reflecting resin is formed such as to enclose the periphery of the mounting area.

With this arrangement, by forming the light reflecting resin such as to enclose the periphery of the mounting area, even light that goes toward the periphery of the mounting area of the substrate can be reflected by the light reflecting resin. Consequently, the loss in output light can be reduced, and the light extraction efficiency of the light emitting device can be improved.

Yet further, the light emitting device according to the invention is preferably arranged such that a metal film is formed on the mounting area and the plurality of light emitting elements are disposed on the mounting area through the metal film.

With this arrangement, by forming a metal film on the mounting area and disposing the plurality of light emitting elements on the metal film, a light proceeding toward the mounting area side of the substrate can be reflected by the metal film. Accordingly, the loss in output light can be reduced to improve the efficiency of light extraction from the light emitting device.

Still further, the light emitting device according to the invention is preferably arranged such that the light reflecting resin is formed such as to cover a part of the margin of the mounting area.

With this arrangement, by forming the light reflecting resin such as to cover a part of the margin of the mounting area 1a, it is prevented that an area, where the substrate is exposed, is formed between the wiring sections and the metal film on the mounting area. Thus, light that is output from the light emitting elements can be reflected all inside the area where the light reflecting resin is formed, and the loss in the output light can be reduced to the maximum to improve the light extraction efficiency of the light emitting device.

In a light emitting device according to the invention, even in a case of arranging a plurality of light emitting elements on a substrate, it is possible to prevent that the voltage between the positive electrode and the negative electrode becomes higher than the zener voltage, and it is thereby possible to appropriately prevent occurrence of element destruction and deterioration of performance of light emitting elements which could be caused when an over voltage is applied.

BRIEF DESCRIPTION OF THE DRAWINGS

FIG. 9 is a front view showing the configuration of a light emitting device in a sixth embodiment according to the invention.

PREFERRED EMBODIMENTS OF THE INVENTION

Figure 1:
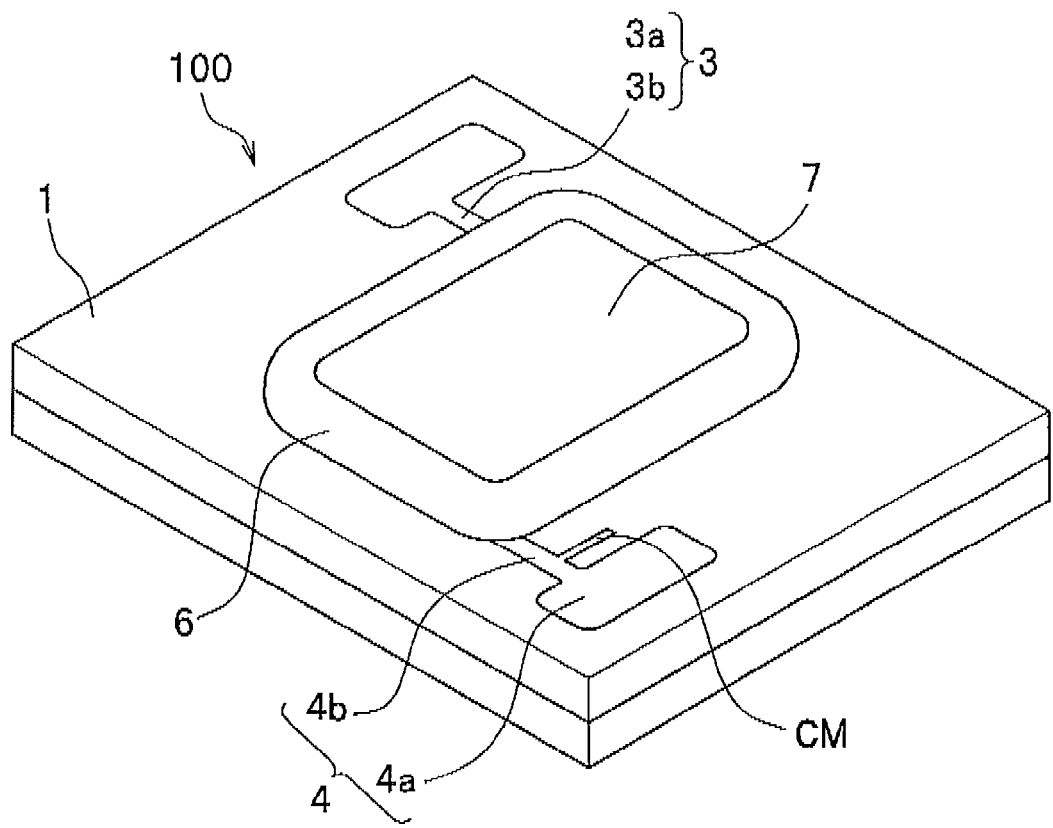
FIG. 1 is a perspective view showing the entire configuration of a light emitting device in an embodiment according to the invention.

A light emitting device in an embodiment according to the invention will be described below, referring to the drawings. Incidentally, the sizes and position relationships of the members shown in the drawings may be partially exaggerated for clear illustration. Further, in the description below, the same name or symbol basically represents the same or equivalent member, and detailed description will be omitted, as appropriate. Further, in FIGS. 2, and 5 to 8, in order to show the directions of respective light emitting elements, only four positions on the mounting area are shown for a p electrode and an n electrode (refer to FIG. 3), and showing of other positions of a p electrode and an n electrode is omitted in these figures.

First Embodiment

Figure 2:
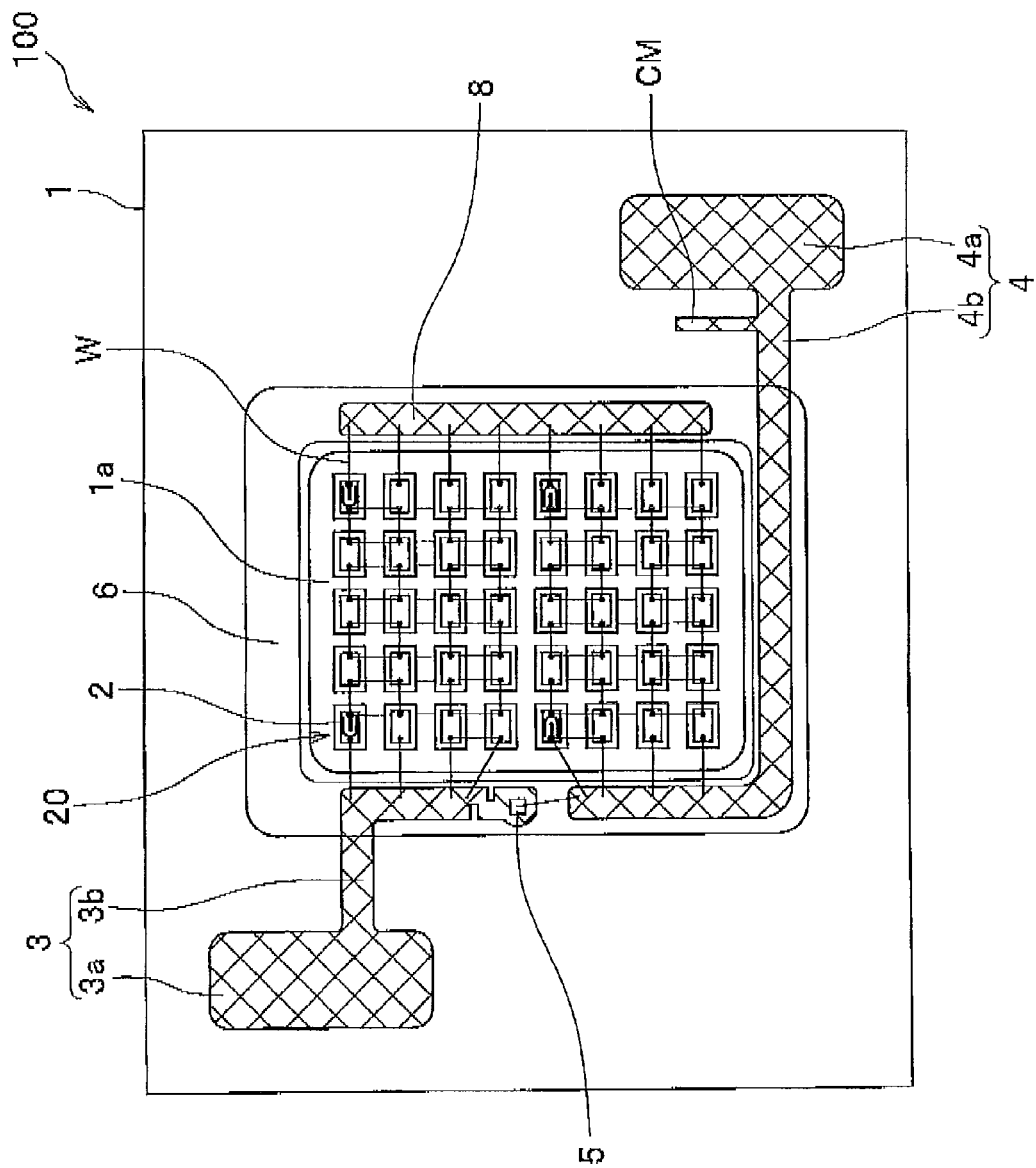
FIG. 2 is a front view showing the configuration of a light emitting device in a first embodiment according to the invention.

A light emitting device 100 according to a first embodiment will be described in detail, referring to FIGS. 1 to 4. In the description below, the entire configuration of the light emitting device 100 will be described first, and then respective configurations will be described. For the convenience of description, a light reflecting resin 6 in FIG. 2 is represented by the outline thereof by lines and curves, and shown in a transparent state. In FIGS. 5 to 9 referred to by other embodiments, a light reflecting resin 6 is likewise shown in a transparent state.

Entire Configuration

Figure 4:
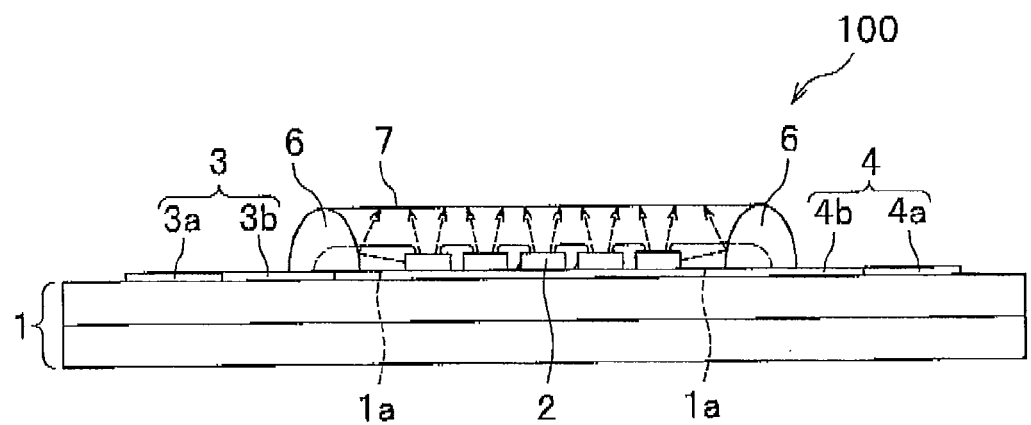
FIG. 4 is a side view showing the configuration of the light emitting device in the first embodiment.

The light emitting device 100 is a device used for a lighting device, such as an LED bulb, a display unit, a display, the back light source of a liquid crystal display, and the like. As shown in FIGS. 1, 2, and 4, the light emitting device 100 mainly includes a substrate 1, a plurality of light emitting elements 2 arranged in a mounting area 1a of the substrate 1, a positive electrode 3 and a negative electrode 4 formed on the substrate 1, a protection element 5 arranged at the positive electrode 3, electronic components including the light emitting elements 2, the protection element 5, etc., wires W connecting the positive electrode 3, the negative electrode 4, etc., and a light reflecting resin 6 formed on the substrate 1. Further, the light emitting device 100 is herein configured such that the light reflecting resin 6 is filled with a sealing member 7.

Substrate

The substrate 1 is arranged to dispose electronic components, such as the light emitting elements 2 and the protection element 5. The substrate 1 is formed in a rectangular flat plate shape, as shown in FIGS. 1 and 2. Further, the mounting area 1a is compartmentalized on the substrate 1, as shown in FIG. 2, to dispose the plurality of light emitting elements 2. The size of the substrate 1 is not particularly limited, and can be appropriately selected, depending on the number of the light emitting elements 2 and the array intervals therebetween, the purpose, and the intended use.

As the material of the substrate 1, an insulating material is preferably used, and further, a material is preferably used through which light emitted from the light emitting elements 2 and external light hardly pass. Further, materials having a certain strength are preferably used, concretely, ceramics ($Al_2O_3$, AlN, etc.) and resins, such as phenol resin, epoxy resin, polyimide resin, BT resin (bismaleimide triazine resin) and polyphthalamide (PPA), and the like.

Mounting Area

The mounting area 1a is an area for arranging the plurality of light emitting elements 2. The mounting area 1a is compartmentalized in the middle of the substrate 1, as shown in FIG. 2. The mounting area 1a is formed in a certain shape having sides facing each other, and more concretely, formed substantially in a rectangular shape with rounded corners, as shown in FIG. 2. The size of the mounting area 1a is not particularly limited, and can be appropriately selected, depending on the number of the light emitting elements 2 and the array intervals therebetween, the purpose, and the intended use.

In the periphery of the mounting area 1a, when FIG. 2 is viewed from the front, a part of a wiring section 3b and a part of a wiring section 4b are formed along the left side of the mounting area 1a; another part of the wiring section 4b is formed along the lower-side of the mounting area 1a; and a relay wiring section 8 is formed along the right-side of the mounting area 1a. The periphery of the mounting area 1a refers to a periphery with a certain distance from the margin of the mounting area 1a, as shown in FIG. 2.

The mounting area 1a may be an area compartmentalized on the substrate 1 to dispose the plurality of light emitting elements 2, in other words, may be formed as an area of the same material as that of the substrate 1, however, it is preferable that a metal film is formed on the mounting area 1a to reflect light, and the plurality of light emitting elements 2 are disposed through the metal film on the mounting area 1a. In such a manner, by forming a metal film on the mounting area 1a and disposing the plurality of light emitting elements 2 on the metal film, for example as shown in FIG. 4, a light proceeding toward the mounting area 1a side of the substrate 1 can be reflected by the metal film. Accordingly, the loss in output light can be reduced to improve the efficiency of light extraction from the light emitting device 100.

The metal film formed on the mounting area 1a is preferably formed by electrolytic plating or electroless plating. The material of the metal film is not particularly limited as long as a material can be subjected to plating, however, for example, Ag (silver) or Au (gold) is preferably used, and particularly silver is preferably used. Although Au has a characteristic of absorbing light, the light reflection ratio can be increased by further forming a $TiO_2$ film on the surface of plated Au. Further, Ag has a higher light reflection ratio than that of Au, and can thereby improve the light extraction efficiency of the light emitting device 100 more than a case of plating with Au alone. The thickness of the metal film to be formed on the mounting area 1a is not particularly limited, and can be selected, as appropriate, depending on the purpose and the intended use.

In the present embodiment, as shown in FIGS. 1 and 4, the upper portion of the mounting area 1a is filled with a later-described sealing member 7 so that the light emitting elements 2 on the mounting area 1a and the wires W connected to the plurality of light emitting elements 2 are protected against dusts, water, external forces, and the like.

Light Emitting Element

A light emitting element 2 is a semiconductor element that emits light by itself when a voltage is applied thereto. Plural light emitting elements 2 are disposed, as shown in FIG. 2, in the mounting area 1a of the substrate 1, and the plural light emitting elements 2 are integrated to configure the light emitting section 20 of the light emitting device 100. The light emitting elements 2 are joined to the mounting area 1a by a joining material, not shown, and as a method of joining, a joining method using, for example, soldering paste as a joining material can be employed. It is needless to say that the light emitting section 20, shown, merely represents the area where the light emitting elements 2 are mounted, and emitting light from the light emitting section 20 refers to emitting light from the light emitting elements 2.

Figure 3:
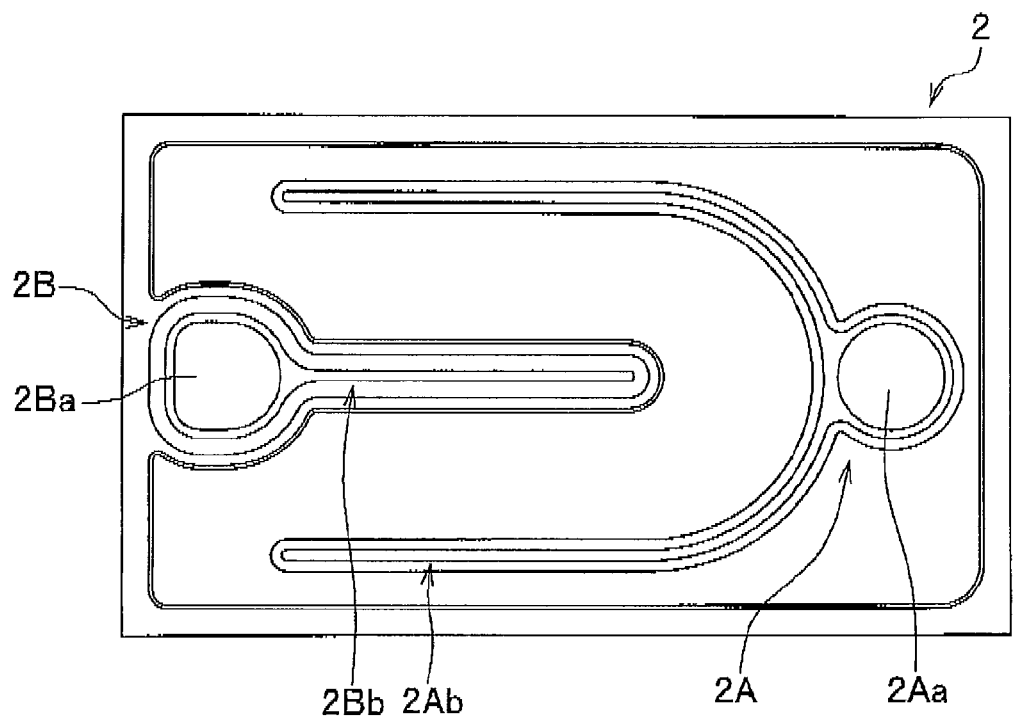
FIG. 3 is an enlarged front view showing the configuration of the light emitting element.

Each of the light emitting elements 2 is formed in a rectangular shape, as shown in FIG. 3. The light emitting element 2 is a face-up (FU) element that is, as shown in FIG. 3, provided with a p-electrode 2A on one side of the top surface thereof and an n-electrode 2B on the other side. In the present embodiment, in order to separate the metal film on the mounting area 1a for mounting the light emitting element 2 from the metal members forming a positive electrode 3 and a negative electrode 4, as shown in FIG. 3, it is preferable to use a light emitting element 2 provided with the p-electrode 2A and the n-electrode 2B formed on the same surface side and join the surface, which is opposite to the electrode-formed surface, with the metal film on the mounting area 1a.

The p-electrode 2A and the n-electrode 2B are, as shown in FIG. 3, respectively provided with a p-pad electrode 2Aa and an n-pad electrode 2Ba being electrode terminals, and a stretched conductive section 2Ab and a stretched conductive section 2Bb being auxiliary electrodes for diffusing a current applied into the light emitting element 2 throughout. Incidentally, the light emitting element 2 can be formed if at least the p-pad electrode 2Aa and the n-pad electrode 2Ba are arranged on the same surface side, and it is not required to provide the stretched conductive section 2Ab and the stretched conductive section 2Bb. Further, though not shown, when viewed from a side, the light emitting element 2 has a structure where a plurality of semiconductor layers formed by n-type semiconductor layers and p-type semiconductor layers are laminated.

As a light emitting element 2, concretely, a light emitting diode is preferably used wherein an arbitrary wavelength can be selected for the diode, depending on the intended use. For example, as light emitting elements 2 for blue color (light with wavelength of 430 nm to 490 nm) and green color (light with wavelength of 490 nm to 570 nm), ZnSe, nitride semiconductor ($In_xAl_yGa_{1-x-y}N$, $0 \leq X$, $0 \leq Y$, $X+Y \leq 1$), GaP, and the like can be used. Further, as a light emitting element 2 for red color (light with wavelength of 620 nm to 750 nm), GaAlAs, AlInGaP, and the like can be used.

Further, as described later, in case of introducing a fluorescent material into the sealing member 7 (refer to FIG. 1), a nitride semiconductor ($In_xAl_yGa_{1-x-y}N$, $0 \leq X$, $0 \leq Y$, $X+Y \leq 1$) capable of emitting light with a short wavelength that can efficiently excite the fluorescent material is preferably used. However, the component composition, the color of emitted light, the size, and the like of the light emitting element 2 is not limited to the above, and can be selected, as appropriate, depending on the intended use. Still further, without being limited to light in the visible light region, the light emitting element 2 can be configured with an element that outputs ultraviolet light or infrared light. Yet further, for a high power output, the number of the light emitting elements 2 is preferably greater than or equal to 10, for example, in a range of 20 to 150.

The light emitting elements 2 are arrayed, as shown in FIG. 2, vertically and horizontally on the mounting area 1a with respective equal intervals, and herein, in a quantity of vertical 8×horizontal 5, and 40 in total. Further, the light emitting elements 2 adjacent to each other in the horizontal direction with respect to the mounting area 1a are, as shown in FIG. 2, electrically and serially connected by conductive wires W. The serial connection herein refers to a state, as shown in FIG. 2, that p-electrodes 2A and n-electrodes 2B of adjacent light emitting elements 2 are electrically connected by wires W.

Light emitting elements 2 are arrayed, as shown in FIG. 2, in the area between the wiring section 3b of the positive electrode 3 and the relay wiring section 8 such that the p-electrodes 2A of the plurality of light emitting elements 2 face towards the left side, which is one direction with respect to the mounting area 1a, while the n-electrodes 2B of the plurality of light emitting elements 2 face the right side, which is the other direction with respect to the mounting area 1a.

Further, the light emitting elements 2 are arrayed, as shown in FIG. 2, in the area between the wiring section 4b of the negative electrode 4 and the relay wiring section 8 such that the p-electrodes 2A of the plurality of light emitting elements 2 face towards the right side, which is the above-described other direction of the mounting area 1a, while the n-electrodes 2B of the plurality of light emitting elements 2 face towards the left side, which is the above-described one direction of the mounting area 1a. That is, when FIG. 2 is viewed in the plan direction, the light emitting elements 2 are disposed such that the upper group (area) and the lower group (area) are reversed from each other in terms of direction, at the meddle of the relay wiring section 8.

In the light emitting device 100 in the present embodiment, in such a manner, the relay wiring section 8 is formed along the periphery of the mounting area 1a, and the light emitting elements 2 are disposed such that the direction is reversed at the middle of the relay wiring section 8. Thus, without making the wiring for connection of the light emitting elements 2 to each other be complicated, the number of serially connected light emitting elements 2 can be increased in a limited area size of the mounting area 1a. Further, it is possible to densely dispose a plurality of light emitting elements 2 in a limited area size of the mounting area 1a, which makes it possible to obtain a light emitting device 100 with improvement in power consumption for a certain brightness, or a light emitting device 100 with improvement in the efficiency of light emission for a certain power consumption. Incidentally, in the light emitting device 100 in the present embodiment, as shown in FIG. 2, ten light emitting elements 2 are serially connected, and such serial connections are formed for four lines.

Positive Electrode and Negative Electrode

The positive electrode 3 and the negative electrode 4 electrically connect the electronic components including the plurality of light emitting elements 2 and the protection element 5 on the substrate 1, with an external power source, not shown, to apply a voltage from the external power source to these electronic components. That is, the positive electrode 3 and the negative electrode 4 take the role of electrodes for applying a current from outside or a part of the role.

The positive electrode 3 and the negative electrode 4 are formed, as shown in FIG. 2, by a metal member on the substrate 1. The positive electrode 3 and the negative electrode 4, as shown in FIG. 2, respectively include a rectangular pad section (power feeding section) 3a, 4a, and a linear wiring section 3b, 4b. Arrangement is made such that a voltage applied to the pad section 3a, 4a is applied to the light emitting section 20 configured by the plurality of light emitting elements 20 via the wiring section 3b, 4b. Incidentally, as shown in FIG. 2, the wiring section 4b of the negative electrode 4 is provided with a cathode marc CM to indicate that the electrode is the cathode.

The pad sections 3a, 4a are arranged to be applied with the voltage from the external power source. The pad sections 3a, 4a are, as shown in FIG. 2, formed in a pair at the diagonal positions in corners on the substrate 1. The pad sections 3a, 4a are electrically connected with the external power source, not shown, by conductive wires W.

The wiring sections 3b, 4b are arranged to transfer a voltage applied to the pad sections 3a, 4a to the light emitting elements 2 on the mounting area 1a. The wiring sections 3b, 4b are, as shown in FIG. 2, formed, extending out from the pad sections 3a, 4a and substantially in an L-shape in the periphery of the mounting area 1a.

One end portion of the wiring section 3b and one end portion of the wiring section 4b are formed, as shown in FIG. 2, such as to be adjacent to each other in the periphery of the mounting area 1a. In such a manner, by forming the respective wiring sections 3b, 4b of the positive electrode 3 and the negative electrode 4 along the periphery of the mounting area 1a and having one end portions thereof be adjacent to each other, the later-described protection element 5 can be disposed at an appropriate position even in a case of disposing a plurality of light emitting elements 2 on the substrate 1 in the light emitting device 100. Accordingly, the voltage between the positive and negative electrodes can be prevented from becoming higher than the zener voltage, and occurrence of element destruction and deterioration of performance of the light emitting elements 2 caused by application of an over voltage can be appropriately prevented.

More concretely, the wiring sections 3b, 4b are preferably formed such that one end portions thereof are adjacent to each other within the range of one side of the substantially rectangular mounting area 1a, shown in FIG. 2. In such a manner, by forming the wiring sections 3b, 4b such that the one end portions thereof are adjacent to each other within the range of a side of the substantially rectangular mounting area 1a, an area for setting the wires W for electrically connecting the wiring sections 3b, 4b and the light emitting elements 2 can be ensured. Consequently, the number of light emitting elements 2 to be connected with the wiring sections 3b, 4b, in other words, the number of light emitting elements 2 to be at the start point and the end point of each serial connection can be increased, and the number of lines of serial connection of light emitting elements 2 on the mounting area 1a can be increased. By thus increasing the number of lines of serial connection, a plurality of light emitting elements 2 can be densely disposed in the limited area size of the mounting area 1a, and it is thereby possible to obtain a light emitting device 100 whose power consumption is improved for a certain brightness, or whose efficiency of light emission is improved for a certain power consumption.

The wiring sections 3b, 4b are preferably formed such that one end portions thereof are adjacent to each other at the midpoint within the range of one side of the substantially rectangular mounting area 1a, shown in FIG. 2. Thereby, the number of lines of serial connection between the wiring section 3b and the relay wiring section 8, and the number of lines of serial connection between the wiring section 4b and the relay wiring section 8, can be set equal to each other. Accordingly, a plurality of light emitting elements 2 can be densely disposed in the limited area size of the mounting area 1a, and it is thereby possible to obtain a light emitting device 100 whose power consumption is improved for a certain brightness, or whose efficiency of light emission is improved for a certain power consumption.

Au is preferably used as the material of the metal members that form the positive electrode 3 and the negative electrode 4. This is because, as described later, when Au, which has an improved thermal conductance, is used as the material of the wires W, the wires W of the same material can be firmly joined.

As a method for forming the positive electrode 3 and the negative electrode 4, forming is preferably performed by electrolytic plating or electroless plating similarly to the above-described method for forming the metal film on the mounting area 1a. The thickness of the metal members for forming the positive electrode 3 and the negative electrode 4 is not particularly limited, and can be appropriately selected, depending on the number of wires W, the purpose, and the intended usage.

Herein, the wiring sections 3b, 4b are partially covered by the later-described light reflecting resin 6, as shown in FIGS. 1 and 2. Thus, even in a case of forming the wiring sections 3b, 4b with Au, which tends to absorb light as described above, light out from the light emitting elements 2 does not reach the wiring sections 3b, 4b and is reflected by the light reflecting resin 6. The loss in output light can be thereby reduced, and the light extraction efficiency of the light emitting device 100 can be improved.

Further, by covering a part of the wiring sections 3b, 4b by the light reflecting resin 6, the wires W can be protected against water, external force, and the like. Herein, a part of the wiring sections 3b, 4b refers to, as shown in FIG. 2, a part, of the wiring section 3b, 4b, that is formed in the periphery of the mounting area 1a and along a side of the mounting area 1a.

In such a manner, in the light emitting device 100, the positive electrode 3 and the negative electrode 4, and the relay wiring section 8 are arranged along the periphery of the mounting area 1a, and the positive electrode 3, the negative electrode 4, the relay wiring section 8 are arranged on the substrate 1, being separated from the mounting area 1a. With such an arrangement, it is possible to use a material (for example, Au), which is capable of firmly joining with the wires W, for the positive electrode 3, the negative electrode 4, and the relay wiring section 8, and also to use a material (for example, Ag) with a high light reflection ratio for the mounting area 1a. Consequently, a highly-reliable light emitting device with an improved light extraction efficiency can be obtained.

Protection Element

The protection element 5 is an element for protecting the light emitting section 20 with a light emitting elements 2 from element destruction and deterioration of performance which could be caused by application of an over voltage. The protection element 5 is, as shown in FIG. 2, disposed at one end portion of the wiring section 3b of the positive electrode 3, and connected with one end portion of the wiring section 4b of the negative electrode 4 by a wire W. However, the protection element 5 may be disposed at the one end portion of the wiring section 4b of the negative electrode 4, and connected with one end portion of the wiring section 3b of the positive electrode 3 by a wire W.

Concretely, the protection element 5 is configured with a zener diode, which becomes into a conduction state when applied with a voltage higher than a prescribed voltage. The protection element 5 is a semiconductor element having a p-electrode and an n-electrode, not shown, similarly to the light emitting elements 2 described above, and is electrically connected with the wiring section 4b of the negative electrode 4 by a wire W such as to be reversely parallel to the p-electrode 2A and the n-electrode 2B of the light emitting elements 2. A light emitting element 2 cannot be disposed in the vicinity of the position where the protection element 5 is arranged. Accordingly, the light emitting element 2 on the fourth line and in the first row that is the closest to the protection element 5 is, as shown in FIG. 2, connected by a wire W at a position distant from the area where the protection element 5 is arranged.

By the presence of the protection element 5, even if a over voltage is applied between the positive electrode 3 and the negative electrode 4 and the voltage thereby exceeds the zener voltage, the voltage between the positive and negative electrodes of the light emitting elements 2 is held at the zener voltage, and does not become higher than the zener voltage.

Thus, by providing the protection element 5, the voltage between the positive and negative electrodes is prevented from exceeding the zener voltage, and thereby, occurrence of element destruction and deterioration of performance of the light emitting elements 2 which could be caused by application of an over voltage is appropriately prevented.

The protection element 5 is, as shown in FIG. 2, covered by the later-described light reflecting resin 6. Thus, the protection element 5 and the wire W connected to the protection element 5 are protected against dusts, water, external forces, and the like. The size of the protection element 5 is not particularly limited, and can be appropriately selected, depending on the purpose and the intended usage.

Light Reflecting Resin

The light reflecting resin 6 is arranged to reflect light that is output from the light emitting elements 2. The light reflecting resin 6 is formed, as shown in FIG. 2, such as to cover a part of the wiring sections 3b, 4b, the relay wiring section 8, the protection element 5, and the wires W connected to these. Thus, even in a case where the wiring sections 3b, 4b, the relay wiring section 8, and the wires W are formed with Au, which tends to absorb light as described above and later, light that is output from the light emitting elements 2 does not reach the wiring sections 3b, 4b, the relay wiring section 8, and the wires W, and is reflected by the light reflecting resin 6. Consequently, the loss in output light can be reduced, and the light extraction efficiency of the light emitting device 100 can be improved. Further, by covering a part of the wiring sections 3b, 4b, the relay wiring section 8, the protection element 5, and the wires W connected to these by the light reflecting resin 6, these members can be protected against dusts, water, external forces, and the like.

The light reflecting resin 6 is preferably formed, as shown in FIGS. 1 and 2, in a rectangular shape such as to enclose the mounting area 1a where the light emitting section 20 is formed on the substrate 1. By forming the light reflecting resin 6 such as to enclose the periphery of the mounting area 1a in such a manner, even light that goes toward the periphery of the mounting area 1a of the substrate 1, for example, a light that is output from light emitting elements 2 disposed on the right and left sides in FIG. 4, can be reflected by the light reflecting resin 6. Consequently, the loss in output light can be reduced, and the light extraction efficiency of the light emitting device 100 can be improved.

Further, the light reflecting resin 6 is preferably formed, as shown in FIG. 2, such as to cover a part of the area that corresponds to the margin of the mounting area 1a. By forming the light reflecting resin 6 in such a manner to cover a part of the margin of the mounting area 1a, it is prevented that an area, where the substrate 1 is exposed, is formed between the wiring sections 3b, 4b and the metal film on the mounting area 1a. Thus, light that is output from the light emitting elements 2 can be reflected all inside the area where the light reflecting resin 6 is formed, and the loss in the output light can be reduced to the maximum to improve the light extraction efficiency of the light emitting device 100.

As the material of the light reflecting resin 6, an insulating material is preferably used. Further, in order to ensure a certain strength, for example, thermo-setting resin, thermo-plastic resin, or the like can be used. More concretely, phenol resin, epoxy resin, BT resin, PPA, silicon resin, or the like can be used. By dispersing, into an above-described base resin, powders of a reflecting material (for example, $TiO_2$, $Al_2O_3$, $ZrO_2$, MgO), which hardly absorbs light from the light emitting elements 2 and has a large refractive index difference with respect to the base resin, it is possible to efficiently reflect light. The size of the light reflecting resin 6 is not particularly limited, and can be appropriately selected, depending on the purpose and the intended usage. Further, it is also possible to form a light reflecting member of a material other than resin at the position of the light reflecting resin 6.

Sealing Member

The sealing member 7 is a member for protecting the light emitting elements 2, the protection element 5, the wires W, and the like disposed on the substrate 1 against dusts, water, external forces, and the like. The sealing member 7 is formed, as shown in FIGS. 1, 2, and 4, by filling the inside of the mounting area 1a, which is enclosed by the light reflecting resin 6, on the substrate 1 with resin.

As the material of the sealing member 7, a translucent material capable of passing light from the light emitting elements 2 is preferable. Concretely, it is possible to use silicon resin, epoxy resin, urea resin, and the like. It is also possible to make such a material to contain a coloring agent, a light diffusion agent, filler, a fluorescent member, or the like.

The sealing member 7 can be formed by a single material, and also can be formed as a multiple layers in two or more. The filling amount of the sealing member 7 is appropriately an amount that covers the light emitting elements 2, the protection element 5, the wires W, and the like disposed in the mounting area 1a enclosed by the light reflecting resin 6. For providing the sealing member 7 with a lens function, the sealing member 7 may be formed in a cannonball shape or a convex lens shape by raising the surface of the sealing member 7.

Fluorescent Member

It is also possible to make the sealing member 7 include a fluorescent member as wavelength conversion member that absorbs at least a part of light from the light emitting elements 2 and emits light with a different wavelength. As the fluorescent member, a member that converts light from the light emitting elements 2 into light with a longer wavelength is preferable. Further, the fluorescent member may be formed as a single layer of one kind of fluorescent material or the like, and may be formed as a single layer of mixture of two or more kinds of fluorescent materials. Otherwise, the fluorescent member may be formed by lamination of two or more layers each of which is a single layer containing one kind of fluorescent material or the like, or by lamination of two or more layers each of which is a single layer containing a mixture of two or more kinds of fluorescent material or the like.

As the material of a fluorescent member, it is possible to use, for example, a YAG phosphor of a mixture of yttrium, aluminum, and garnet, a nitride phosphor primarily activated by lanthanoid element such as Eu, Ce, etc., or an oxynitride phosphor.

Relay Wiring Section

The relay wiring section 8 is arranged to relay the wiring between the positive electrodes 3 and the negative electrodes 4. The relay wiring section 8 is, as shown in FIG. 2, formed by a metal member on the substrate 1. The relay wiring section 8 is formed in the periphery of the mounting area 1a, as shown in FIG. 2, in a linear shape along one side of the mounting area 1a, namely the right side.

The relay wiring section 8 is covered by the light reflecting resin 6, as shown in FIG. 2. Thus, as described later, even in a case of using Au, which tends to absorb light, as the metal member forming the relay wiring section 8, light that is output from the light emitting elements 2 does not reach the relay wiring section 8 and is reflected by the light reflecting resin 6. Consequently, the loss in output light can be reduced, and the light extraction efficiency of the light emitting device 100 can be improved. Further, by covering the relay wiring section 8 with the light reflecting resin 6, the relay wiring section 8 can be protected against dusts, water, external forces, and the like.

As the material of the metal member for the relay wiring section 8, Au is preferably used, similarly to the positive electrode 3 and the negative electrode 4. This is because, in a case of using Au having an improved thermal conductivity as the material of the wires W, the wires W of the same material can be firmly joined.

As a method for forming the metal member for the relay wiring section 8, forming is preferably performed by electrolytic plating or electroless plating similarly to the case of the positive electrode 3 and the negative electrode 4. The thickness of the metal member for the relay wiring section 8 is not particularly limited, and can be appropriately selected, depending on the number of the wires W, the purpose, and the intended usage.

In the light emitting device 100 in the present embodiment, the relay wiring section 8 is formed along the periphery of the mounting area 1a in such a manner, and further, the light emitting elements 2 are disposed such that the direction thereof is reversed at the relay wiring section 8. Thus, without making the wiring for connection of the light emitting elements 2 to each other be complicated, the number of serially connected light emitting elements 2 can be increased in a limited area size of the mounting area 1a. Further, it is possible to densely dispose a plurality of light emitting elements 2 in a limited area size of the mounting area 1a, which makes it possible to obtain a light emitting device 100 with improvement in power consumption for a certain brightness, or a light emitting device 100 with improvement in the efficiency of light emission for a certain power consumption.

Wire

The wires W are conductive wires for electrically connecting the electronic components such as the light emitting elements 2 and the protection element 5, the positive electrode 3, the negative electrode 4, the relay wiring section 8, and the like. The material of the wires W can be metals, such as Au, Cu (copper), Pt (platinum), Al (aluminum), and the like, and an alloy of these, and particularly, Au, which has an excellent thermo conductivity and the like, is preferably used. The diameter of the wires W is not particularly limited, and can be appropriately selected, depending on the purpose and the intended usage.

Herein, the connection portion between the wires W, the positive electrode 3, the negative electrode 4, and the relay wiring section 8 is, as shown in FIG. 2, covered by the light reflecting resin 6. Accordingly, even in a case of using Au, which tends to absorb light, as the material for the wires W, as described above, light that is output from the light emitting elements 2 is not absorbed by the wires W, but is reflected by the light reflecting resin 6. Consequently, the loss in output light can be reduced, and the light extraction efficiency of the light emitting device 100 can be improved. Further, by covering the connection portion between the wires W, the positive electrode 3, the negative electrode 4, and the relay wiring section 8 with the light reflecting resin 6, the wires can be protected against dusts, water, external forces, and the like. The light extracted from the light emitting device 100 is, as shown in FIGS. 1 and 4, light extracted from the surface of the sealing member 7 enclosed by the light reflecting resin 6. That is, the surface of the sealing member 7 is the light emitting surface of the light emitting device 100.

Operation of Light Emitting Device

Regarding the light emitting device 100 having been described above, when the light emitting device 100 is driven, from lights going out from the light emitting elements 2 into all directions, lights going upward is extracted outside above the light emitting device 100. Further, lights going below and lights going into horizontal directions and other directions reflect on the bottom surface or the side surfaces in the mounting area 1a of the substrate 1, resulting in being extracted above the light emitting device 100. Herein, the bottom surface of the substrate 1, in other words, the mounting area 1a is preferably covered with a metal film, and the light reflecting resin 6 is formed around the mounting area 1a. Accordingly, absorption of light at this portion is reduced and light is reflected by the metal film and the light reflecting resin 6. Consequently, light from the light emitting elements 2 is efficiently extracted. Further, for the light emitting device 100, as it is possible to increase the number of light emitting elements 2 to be serially connected by the relay wiring section 8, it is possible to improve the power consumption for a certain brightness, or improve the efficiency of light emission for a certain power consumption.

Method for Manufacturing Light Emitting Device

A method for manufacturing the light emitting device 100 in the first embodiment according to the invention will be briefly described below. The method for manufacturing the light emitting device 100 includes a substrate producing process, a plating process, a die bonding process, a wire bonding process, and a light reflecting resin forming process. Further, subsequent to the light reflecting resin forming process, a sealing member filling process may be included. Still further, herein, a protection element joining process is included. The respective processes will be described below. Incidentally, as the configuration of the light emitting device 100 has been described above, description will be omitted below, as appropriate.

Substrate Producing Process

The substrate producing process is a process for producing the substrate 1 provided with wires for plating. In the substrate producing process, the substrate 1 is formed by patterning the portions to be the mounting area 1a, the positive electrode 3, and the negative electrode 4 on the substrate 1 into certain shapes. Further, in the substrate producing process, wires for plating are formed for forming a metal film in the mounting area 1a on the substrate 1 by electrolytic plating.

Plating Process

The plating process is a process for forming at least metal members for the positive electrode 3 and the negative electrode 4 on the substrate 1 provided with the above-described wires, wherein the metal members for the positive electrode 3 and the negative electrode 4 are formed preferably by electroless plating, and a metal film is formed on the mounting area 1a of the substrate 1 by electrolytic plating. Further, in providing the relay wiring section 8, a metal member is formed in a process similar to the process for the positive electrode 3 and the negative electrode 4.

As a concrete method for plating, there are methods, such as a method by performing Au plating on the positive electrode 3 and the negative electrode 4, and the metal film on the mounting area 1a as well; a method by performing Au plating only on the positive electrode 3 and the negative electrode 4 without forming a metal film on the mounting area 1a; and a method by performing Au plating on the positive electrode 3 and the negative electrode 4 and performing Ag plating on the mounting area 1a. Further, a film of $TiO_2$ is preferably formed, on the surface of Au or Ag in the case of performing AU plating or Ag plating on the mounting area 1a, or directly on the surface of the substrate 1 in the case of not performing plating.

Die Bonding Process

The die bonding process is a process for mounting light emitting elements 2 on the above-described metal film. The die bonding process performs a light emitting element mounting process for mounting light emitting elements 2 on the metal film on the mounting area 1a through a joining material, and a heating process for joining the light emitting elements 2 on the metal film on the mounting area 1a by heating the joining material after mounting the light emitting elements 2.

Protection Element Joining Process

The protection element joining process is a process for mounting and joining the protection element 5 on the wiring section 3b of the positive electrode 3. A method for mounting and joining the protection element 5 is similar to the above-described die bonding process, and description is omitted here.

Wire Bonding Process

The wire bonding process, which is subsequent to the die bonding process, is a process for electrically connecting, with wires W, the wiring section 3b of the metallic positive electrode 3 and the p-pad electrodes 2Aa at the top of light emitting elements 2. The wire bonding process is also a process for electrically connecting, with wires W, the n-pad electrodes 2Ba at the top of light emitting elements 2 and the wiring sections 4b of the metallic negative electrode 4. Further, in this process, a plurality of light emitting elements 2 are connected through the respective p-pad electrodes 2Aa and the respective n-pad electrodes 2Ba. Further, electrical connection between the protection element 5 and the negative electrode 4 can be carried out in this process. That is, the n-electrode of the protection element 5 and the wiring section 4b of the negative electrode 4 are connected with wires W. The method for connecting with wires W is not particularly limited, and an ordinarily used method can be employed.

Light Reflecting Resin Forming Process

The light reflecting resin forming process, which is subsequent to the wire bonding process, is a process for forming the light reflecting resin 6 such that the light reflecting resin 6 covers at least a part of the wiring section 3b and the wiring section 4b, and the relay wiring section 8, along the margin of the mounting area 1a. Forming the light reflecting resin 6 can be performed, for example, using a resin ejecting device that is movable with respect to the substrate 1 in the vertical direction or in the horizontal direction, above the fixed substrate 1 (refer to JP 2009-182307 A).

Sealing Member Filling Process

The sealing member filling process is a process for filling the inside of the light reflecting resin 6 with a translucent sealing member 7 for covering the light emitting elements 2 and the metal film. That is, in the sealing member filling process, the inside of the wall portion formed by the light reflecting resin 6 on the substrate 1 is filled with the sealing member 7 that covers the light emitting elements 2, the protection element 5, and the metal film, the wires W, etc. on the mounting area 1a, such that molten resin is injected inside the wall portion and thereafter cured by heating, irradiation with light, or the like.

Second Embodiment

Figure 5:
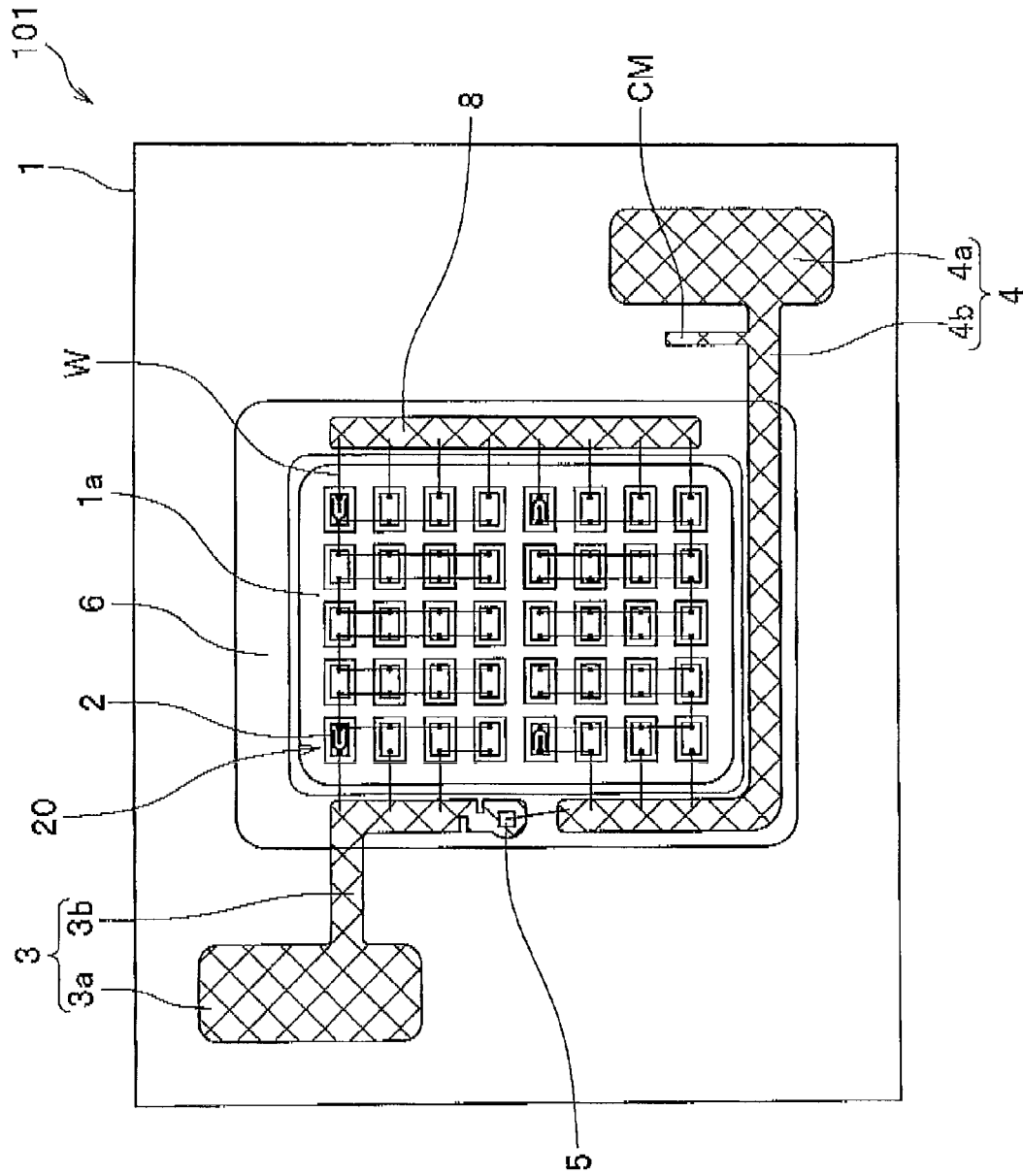
FIG. 5 is a front view showing the configuration of a light emitting device in a second embodiment according to the invention.

A light emitting device 101 in a second embodiment will be described below, referring to FIG. 5. The light emitting device 101 has, as shown in FIG. 5, a configuration similar to that of the above-described light emitting device 100 in the first embodiment except the state of wiring of wires W. Accordingly, overlapped elements with those of the above-described light emitting device 100 will be given with the same symbols, and description of them will be omitted. Further, the light emitting device 101 has the same entire configuration (FIG. 1) and the same configuration of light emitting elements (FIG. 3) as those of the above-described light emitting device 100, and accordingly description of these will be omitted.

In the light emitting device 101, as shown in FIG. 5, light emitting elements 2 adjacent to each other in the horizontal and vertical directions with respect to a mounting area 1a are electrically connected by conductive wires W serially and in parallel. As shown in FIG. 5, parallel connection here refers to the state of electrical connection between p-electrodes 2A and electrical connection between n-electrodes 2B of light emitting elements 2 adjacent to each other.

In such a manner, by connecting the plurality of light emitting elements 2 to each other not only serially but also in parallel, even if there is a variation in the forward voltage drop (hereinafter, referred to as $V_f$) between a plurality of individual light emitting elements 2, the variation in $V_f$ can be eliminated. Incidentally, $V_f$ refers to a voltage required to apply a current through a light emitting diode in the forward direction, in other words, the voltage required by a light emitting diode to emit light.

Herein, when there is a variation in $V_f$ between a plurality of individual light emitting elements 2, a current easily flows in a light emitting element 2 with a low $V_f$, which causes differences in output between light emitting elements 2 and accordingly causes uneven light emission. In this situation, as described above, by connecting light emitting elements 2 in parallel, it is possible to reduce the differences in output between light emitting elements 2 due to variation in $V_f$ between light emitting elements 2 connected in parallel, and to reduce variation in emitted light.

As described above, in a case of connecting a plurality of light emitting elements 2 in parallel, it is preferable, as shown in FIG. 5, that among the plurality of light emitting elements 2, the light emitting elements 2 which are directly connected with the wiring sections 3b, 4b, and the relay wiring section 8 are not connected with each other in parallel. That is, in the light emitting device 101, no parallel connection is made between the respective p-electrodes 2A of the light emitting elements 2 respectively on 1st line/1st row and on 2nd line/1st row in the mounting area 1a, the respective p-electrodes 2A being directly connected with the wiring section 3b, between the respective n-electrodes 2B of the light emitting elements 2 respectively on 7th line/1st row and on 8th line/1st row in the mounting area 1a, the respective n-electrodes 2B being directly connected with the wiring section 4b, between respective n-electrodes 2B respectively on 1st line/5th row, 2nd line/5th row, 3rd line/5th row, and 4th line/5th row, the respective n-electrodes 2B being directly connected with the relay wiring section 8, and between respective p-electrodes 2A respectively on 5th line/5th row, 6th line/5th row, 7th line/5th row, and 8th line/5th row, the respective p-electrodes 2A being directly connected with the relay wiring section 8. Thus, the load caused by wires W can be reduced.

Third Embodiment

Figure 6:
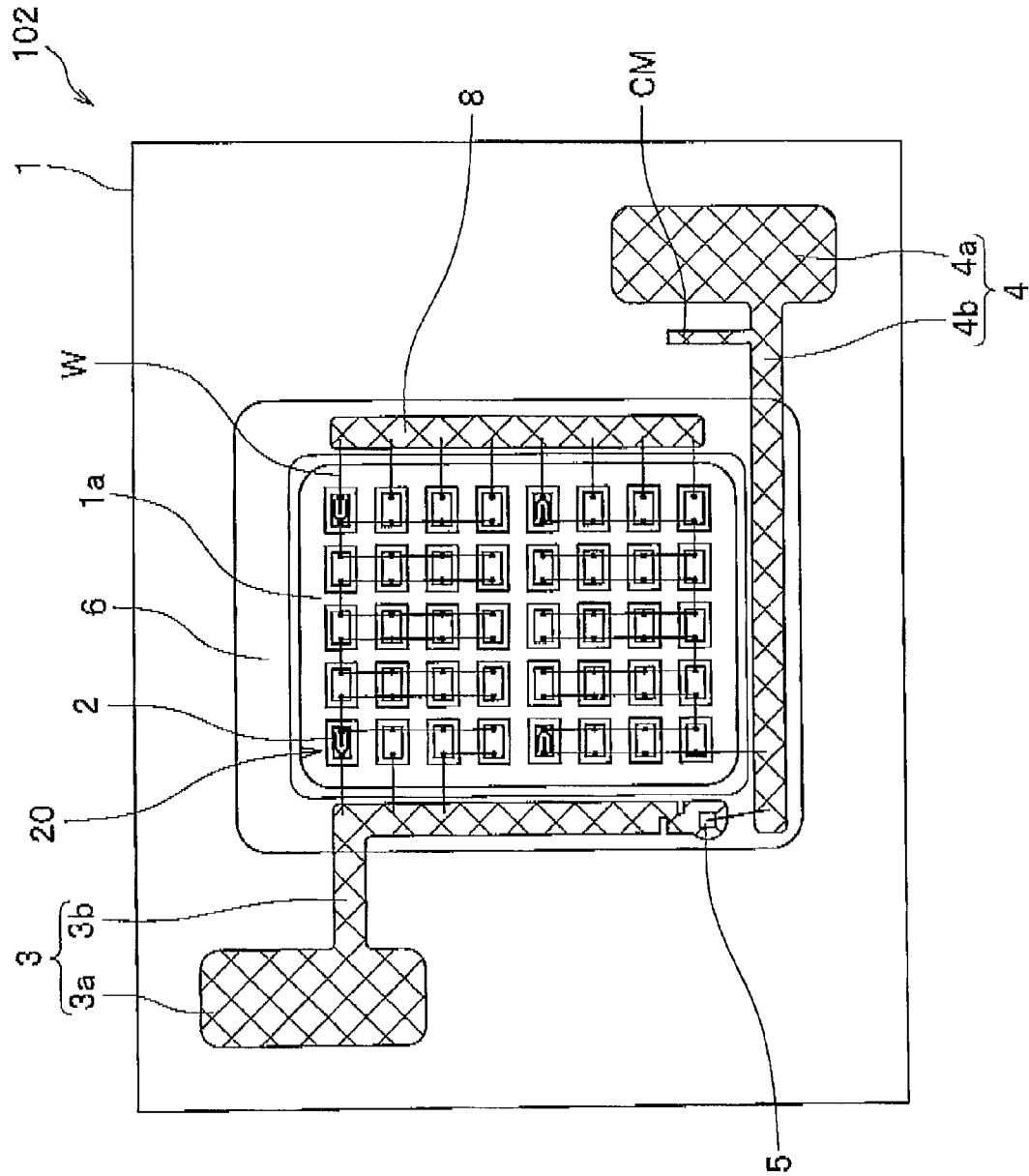
FIG. 6 is a front view showing the configuration of a light emitting device in a third embodiment according to the invention.

A light emitting device 102 in a third embodiment will be described in detail, referring to FIG. 6. The light emitting device 102 has, as shown in FIG. 6, a configuration similar to that of the above-described light emitting device 100 in the first embodiment except the shapes of a wiring section 3b and a wiring section 4b and the state of wiring of wires W. Accordingly, overlapped elements with those of the above-described light emitting device 100 will be given with the same symbols, and description of them will be omitted. Further, the light emitting device 102 has the same entire configuration (FIG. 1) and the same configuration of light emitting elements (FIG. 3) as those of the above-described light emitting device 100, and accordingly description of these will be omitted.

In the light emitting device 102, as shown in FIG. 6, one end portions of the wiring section 3b and the wiring section 4b are formed adjacent to each other at a corner portion of a substantially rectangular mounting area 1a. That is, the wiring section 3b is formed substantially in an L-shape, extending from a pad section 3a to the corner portion of the mounting area 1a. Further, the wiring section 4b is formed linearly, extending from a pad section 4a to the corner portion of the mounting area 1a.

In the light emitting device 102 with such a configuration, by forming a relay wiring section 8 along the periphery of the mounting area 1a and disposing light emitting elements 2 such that the direction of the light emitting elements 2 is reversed at the relay wiring section 8, the number of serially connected light emitting elements 2 can be increased in a limited area size of the mounting area 1a without making the wiring for connection of the light emitting elements 2 to each other be complicated. Further, it is possible to densely dispose a plurality of light emitting elements 2 in a limited area size of the mounting area 1a, which makes it possible to obtain a light emitting device 102 with improvement in power consumption for a certain brightness, or a light emitting device 102 with improvement in the efficiency of light emission for a certain power consumption. Further, by connecting light emitting elements 2 to each other not only serially but also in parallel, even if there is a variation in $V_f$ between a plurality of individual light emitting elements 2, the variation in $V_f$ can be eliminated.

Fourth Embodiment

Figure 7:
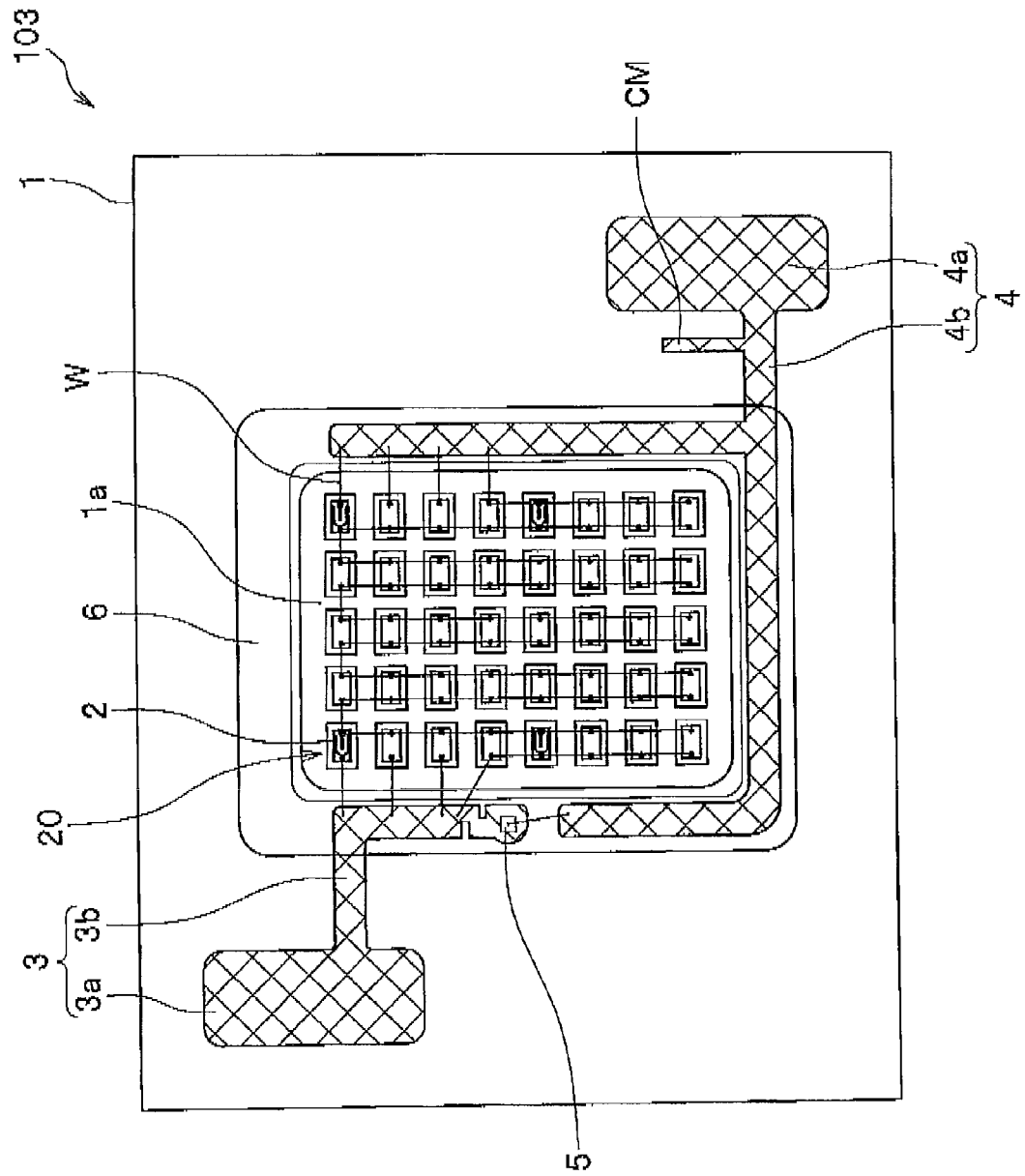
FIG. 7 is a front view showing the configuration of a light emitting device in a fourth embodiment according to the invention.

A light emitting device 103 in a fourth embodiment will be described in detail, referring to FIG. 7. The light emitting device 103 has, as shown in FIG. 7, a configuration similar to that of the above-described light emitting device 100 in the first embodiment except the shape of a wiring section 4b and the state of wiring of wires W. Accordingly, overlapped elements with those of the above-described light emitting device 100 will be given with the same symbols, and description of them will be omitted. Further, the light emitting device 103 has the same entire configuration (FIG. 1) and the same configuration of light emitting elements (FIG. 3) as those of the above-described light emitting device 100, and accordingly description of these will be omitted.

In the light emitting device 103, as shown in FIG. 7, one end portion of a wiring section 3b and one end portion of a wiring section 4b are formed adjacent to each other in the periphery of a mounting area 1a. Further, a relay wiring section 8, which is independent from a positive electrode 3 and a negative electrode 4, is not provided, and the wiring section 4b of the negative electrode 4 is extended in the periphery of the mounting area 1a and along the right side, which is one side of the mounting area 1a.

In the light emitting device 103 with such a configuration, by forming the respective wiring sections 3b, 4b of the positive electrode 3 and the negative electrode 4 along the periphery of the mounting area 1a and such that one end portions thereof are adjacent to each other, it is possible to dispose a later-described protection element 5 at an appropriate position even when a plurality of light emitting elements 2 are disposed on a substrate 1 in the light emitting device 103. Accordingly, the voltage between the positive and negative electrodes can be prevented from becoming higher than the zener voltage, and occurrence of element destruction and deterioration of performance of the light emitting elements 2 caused by application of an over voltage can be appropriately prevented.

Fifth Embodiment

Figure 8:
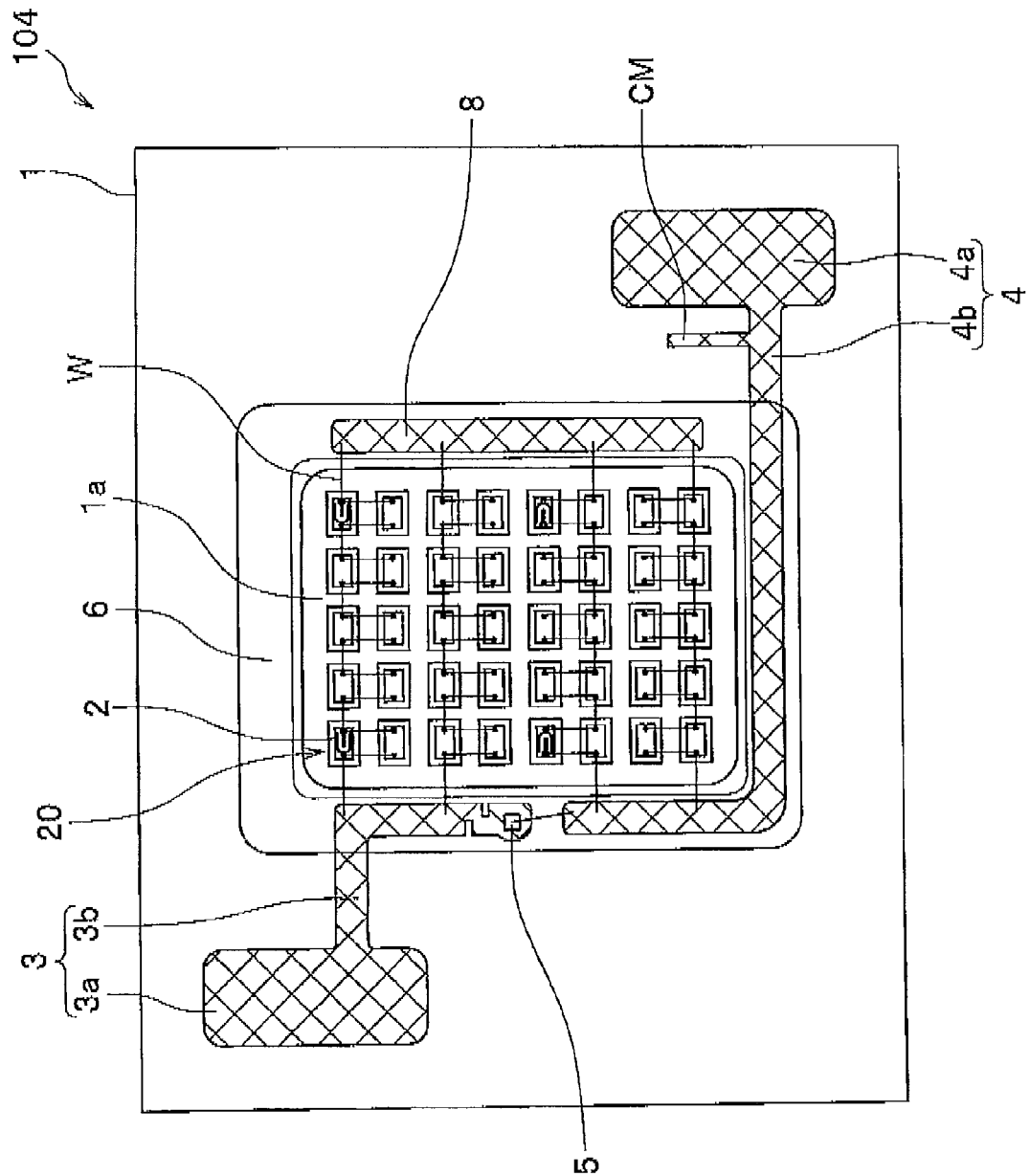
FIG. 8 is a front view showing the configuration of a light emitting device in a fifth embodiment according to the invention.

A light emitting device 104 in a fifth embodiment will be described in detail, referring to FIG. 8. The light emitting device 104 has, as shown in FIG. 8, a configuration similar to that of the above-described light emitting device 101 in the second embodiment except the state of wiring of wires W. Accordingly, overlapped elements with those of the above-described light emitting device 101 will be given with the same symbols, and description of them will be omitted. Further, the light emitting device 104 has the same entire configuration (FIG. 1) and the same configuration of light emitting elements (FIG. 3) as those of the above-described light emitting device 101, and accordingly description of these will be omitted.

In the light emitting device 104, as shown in FIG. 8, wires connecting a wiring section 3b and a relay wiring section 8 and wires connecting a wiring section 4b and the relay wiring section 8 are respectively arranged as ladder wires. In the light emitting device 104 with such a configuration, by connecting a plurality of light emitting elements 2 to each other not only serially but also in parallel, variation in $V_f$ between the plurality of individual light emitting elements 2 can be eliminated.

Sixth Embodiment

A light emitting device 105 in a sixth embodiment will be described in detail, referring to FIG. 9. The light emitting device 105 has, as shown in FIG. 9, a configuration similar to that of the above-described light emitting device 100 in the first embodiment except the shape of a mounting area 1a and the shapes of a wiring section 3b and a wiring section 4b. Accordingly, overlapped elements with those of the above-described light emitting device 100 will be given with the same symbols, and description of them will be omitted. Further, the light emitting device 105 has the same configuration of light emitting elements (FIG. 3) as those of the above-described light emitting device 100, and accordingly description of these will be omitted.

While the mounting area 1a in the light emitting device 100 is formed substantially in a rectangular shape, a mounting area 1a in the light emitting device 105 is formed, as shown in FIG. 9, in a circular shape. In this mounting area 1a in the circular shape, as shown in FIG. 9, a plurality of light emitting elements 2 are arrayed in the vertical direction and the horizontal direction with respective equal intervals. The plurality of light emitting elements 2 are, as shown in FIG. 9, disposed with a maximum quantity of 10 elements and with a minimum quantity of 3 elements in the vertical direction, with a maximum quantity of 14 elements and with a minimum quantity of 6 elements in the vertical direction, and with a total quantity of 110 elements. Further, the respective wiring sections 3b and 4b of a positive electrode 3 and a negative electrode 4 are, as shown in FIG. 9, formed along the periphery of the circular mounting area such that respective both end portions thereof are adjacent to each other.

A light reflecting resin 6 is formed in a circular shape such as to enclose the mounting area 1a where a light emitting section 20 is formed. Further, the light reflecting resin 6 is formed such as to cover a part of the wiring sections 3b, 4b, a protection element 5, and wires W connected to these. Incidentally, symbol AM is an anode mark representing that a pad section 3a is the positive electrode 3, symbol 30 is a metal film formed on the mounting area, recognition mark 70 is a recognition mark for recognizing the bonding position of light emitting elements 2, and symbol 80 is the temperature measuring point of the light emitting device light emitting device 104. These are formed by plating or the like.

In the light emitting device 105 with such a configuration, by forming the respective wiring sections 3b, 4b of the positive electrode 3 and the negative electrode 4 along the periphery of the circular mounting area 1a and such that one end portions thereof are adjacent to each other, it is possible to dispose the above-described protection element 5 at an appropriate position even when a plurality of light emitting elements 2 are disposed in the circular mounting area 1a on the substrate 1 in the light emitting device 105. Accordingly, in the light emitting device 105, the voltage between the positive and negative electrodes can be prevented from becoming higher than the zener voltage, and occurrence of element destruction and deterioration of performance of the light emitting elements 2 caused by application of an over voltage can be appropriately prevented.

Light emitting devices according to the invention have been concretely described above, referring to embodiments for carrying out the invention, however, the spirit of the invention is not limited to these descriptions, and should be broadly and widely understood, according to the descriptions set forth in the claims of the present patent application. Further, it is needless to say that the spirit of the invention includes various changes and modifications based on these descriptions.

What is claimed is:

1. A light emitting device, comprising:
   a substrate;
   a light emitting section including a plurality of light emitting elements disposed in a mounting area on the substrate;
   a positive electrode and a negative electrode both of which having a pad section and a wiring section, wherein the positive and negative electrodes apply voltage to the light emitting section through the respective wiring sections;
   a protection element that is disposed at one of the positive electrode and the negative electrode and electrically connected with the other one of the positive electrode and the negative electrode; and
   a light reflecting resin formed on the substrate so as to cover at least a part of the wiring sections and the protection element,
   wherein, in a plan view, the wiring section of the positive electrode and the wiring section of the negative electrode are formed along a periphery of the mounting area such that an end portion of the wiring section of the positive electrode is adjacent to an end portion of the wiring section of the negative electrode along the periphery of the mounting area in the plan view,
   wherein, for one electrode, which is the positive electrode or the negative electrode:
      a part of the one electrode is not covered by the light reflecting resin,
      at least a part of the wiring section of the one electrode is covered by the light reflecting resin, and
      in the plan view, the part of the one electrode which is not covered by the light reflecting resin is located further away from the mounting area, than the part of the wiring section of the one electrode which is covered by the light reflecting resin, and
   wherein, in the plan view, the pad section of the positive electrode and the pad section of the negative electrode are located at diagonal positions on the substrate, and in the plan view said entire light reflecting resin is located between:
      the pad section of the positive electrode and
      the pad section of the negative electrode.

2. The light emitting device according to claim 1, further comprising:
   a relay wiring section formed along the periphery of the mounting area,
   wherein each of the plurality of light emitting elements comprises a p-electrode formed on one side and an n-electrode formed on the other side,
   wherein the p-electrodes between the wiring section of the positive electrode and the relay wiring section are arrayed such as to face one direction with respect to the mounting area,
   and wherein the p-electrodes between the wiring section of the negative electrode and the relay wiring section are arrayed such as to face the other one direction with respect to the mounting area.

3. The light emitting device according to claim 1, wherein the plurality of light emitting elements are electrically connected to each other both serially and in parallel.

4. The light emitting device according to claim 2, wherein the plurality of light emitting elements are electrically connected to each other both serially and in parallel.

5. The light emitting device according to claim 1,
   wherein the mounting area is formed in a predetermined shape having sides which face each other,
   and wherein the wiring section of the positive electrode and the wiring section of the negative electrode are formed within a range of one side of the mounting area such that one end portions thereof are adjacent to each other.

6. The light emitting device according to claim 2,
   wherein the mounting area is formed in a predetermined shape having sides which face each other,
   and wherein the wiring section of the positive electrode and the wiring section of the negative electrode are formed within a range of one side of the mounting area such that one end portions thereof are adjacent to each other.

7. The light emitting device according to claim 3,
   wherein the mounting area is formed in a predetermined shape having sides which face each other,
   and wherein the wiring section of the positive electrode and the wiring section of the negative electrode are formed within a range of one side of the mounting area such that one end portions thereof are adjacent to each other.

8. The light emitting device according to claim 4,
   wherein the mounting area is formed in a predetermined shape having sides which face each other,
   and wherein the wiring section of the positive electrode and the wiring section of the negative electrode are formed within a range of one side of the mounting area such that one end portions thereof are adjacent to each other.

9. The light emitting device according to claim 1,
   wherein the mounting area is formed in a circular shape,
   and wherein the wiring section of the positive electrode and the wiring section of the negative electrode are formed in the periphery of the circular mounting area such that one end portions thereof are adjacent to each other.

10. The light emitting device according to claim 1, wherein the light reflecting resin is formed such as to enclose the periphery of the mounting area.

11. The light emitting device according to claim 1, wherein a metal film is formed on the mounting area and the plurality of light emitting elements are disposed on the mounting area through the metal film.

12. The light emitting device according to claim 11, wherein the light reflecting resin is formed such as to cover a part of a margin of the mounting area.

13. The light emitting device according to claim 1,
wherein the mounting area is formed in a predetermined shape having sides which face each other, and
the wiring section of the positive electrode and the wiring section of the negative electrode are formed within a range of one side of the mounting area such that one end portions thereof are adjacent to each other, and
wherein the light reflecting resin is formed such as to enclose the periphery of the mounting area.

14. The light emitting device according to claim 1,
wherein the mounting area is formed in a circular shape, and the wiring section of the positive electrode and the wiring section of the negative electrode are formed in the periphery of the circular mounting area such that one end portions thereof are adjacent to each other, and
wherein the light reflecting resin is formed such as to enclose the periphery of the mounting area.

15. The light emitting device according to claim 1,
wherein the mounting area is formed in a predetermined shape having sides which face each other, and
the wiring section of the positive electrode and the wiring section of the negative electrode are formed within a range of one side of the mounting area such that one end portions thereof are adjacent to each other, and
wherein the light reflecting resin is formed such as to enclose the periphery of the mounting area, and wherein
a metal film is formed on the mounting area and the plurality of light emitting elements are disposed on the mounting area through the metal film,
and the light reflecting resin is formed such as to cover a part of a margin of the mounting area.

16. The light emitting device according to claim 1,
wherein the mounting area is formed in a circular shape, and the wiring section of the positive electrode and the wiring section of the negative electrode are formed in the periphery of the circular mounting area such that one end portions thereof are adjacent to each other, and
wherein the light reflecting resin is formed such as to enclose the periphery of the mounting area, and
wherein a metal film is formed on the mounting area and the plurality of light emitting elements are disposed on the mounting area through the metal film, and
the light reflecting resin is formed such as to cover a part of a margin of the mounting area.

17. The light emitting device according to claim 1, wherein the mounting area is formed in a circular shape.

18. The light emitting device according to claim 1,
wherein a material of the substrate is selected from a group consisting of $Al_2O_3$, AlN, phenol resin, epoxy resin, polyimide resin, BT resin and polyphthalamide.

19. The light emitting device according to claim 1,
wherein a metal film formed on the mounting area is formed by Ag (silver).

20. The light emitting device according to claim 1,
wherein the light emitting elements are nitride semiconductors.

21. The light emitting device according to claim 1,
wherein the wiring sections are formed in an L-shape.

22. The light emitting device according to claim 1,
wherein the light reflecting resin is formed in a rectangular shape.

23. The light emitting device according to claim 1,
wherein the light reflecting resin is formed in a circular shape.

24. The light emitting device according to claim 1,
wherein a notch is disposed at both sides of the protection element mounted on one of the wiring sections.

25. The light emitting device according to claim 1,
wherein a notch is disposed at one side of the protection element mounted on one of the wiring sections.

26. The light emitting device according to claim 1,
wherein a notch near the protection element is disposed at an inner side of the protection element mounted on one of the wiring sections.

27. The light emitting device according to claim 1,
wherein a material of the mounting area is the same as that of the substrate.

28. The light emitting device according to claim 1,
wherein a material of the mounting area is a metal film.

29. The light emitting device according to claim 1,
wherein a plurality of wires connected to the positive electrode and a plurality of wires connected to the negative electrode are disposed adjacent to each other.

30. The light emitting device according to claim 1,
wherein the pad sections are formed extending out from the light reflecting resin.

31. The light emitting device according to claim 1,
wherein the wiring section of the positive electrode and the wiring section of the negative electrode are formed in a circular shape.

32. The light emitting device according to claim 1,
wherein the wiring sections are formed in a circular shape, and
wherein the light reflecting resin is formed in a circular shape so as to cover a part of the wiring sections.

33. The light emitting device according to claim 1,
wherein, for one electrode, which is the positive electrode or the negative electrode:
in the plan view, the entire part of the one electrode which is not covered by the light reflecting resin is located further away from the mounting area, than the part of the wiring section of the one electrode which is covered by the light reflecting resin.

* * * * *